(12) United States Patent
Shi et al.

(10) Patent No.: US 7,832,333 B2
(45) Date of Patent: Nov. 16, 2010

(54) HOUSING AND METHOD FOR MAKING THE SAME

(75) Inventors: Zheng Shi, Shenzhen (CN); Chih-Chiang Chang, Taipei Hsien (TW)

(73) Assignees: Shenzhen Futaihong Precision Industry Co., Ltd., Shenzhen, Guangdong Province (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 12/407,152

(22) Filed: Mar. 19, 2009

(65) Prior Publication Data

US 2009/0235833 A1 Sep. 24, 2009

(30) Foreign Application Priority Data

Mar. 24, 2008 (CN) .................. 2008 1 0300683

(51) Int. Cl.
*B41F 13/00* (2006.01)
*B41F 1/18* (2006.01)
*B41F 7/00* (2006.01)
*G03F 7/00* (2006.01)

(52) U.S. Cl. ............... 101/129; 101/114; 101/450.1; 430/302

(58) Field of Classification Search .............. 428/195.1, 428/32.1, 323, 325, 423.3; 101/129, 450.1; 430/7
See application file for complete search history.

(56) References Cited

U.S. PATENT DOCUMENTS

| 5,629,136 A | * | 5/1997 | Higashi et al. ........... 430/272.1 |
| 2007/0190313 A1 | * | 8/2007 | Willemse .................... 428/325 |
| 2009/0064878 A1 | * | 3/2009 | Chang et al. ................. 101/126 |

\* cited by examiner

*Primary Examiner*—Cynthia H Kelly
*Assistant Examiner*—Chanceity N Robinson
(74) *Attorney, Agent, or Firm*—Steven M. Reiss

(57) ABSTRACT

A housing includes a substrate and a decorative layer formed on one surface of the substrate. The decorative layer includes two colored ink coatings, each of which is partially interlaced with the other and has a color depth decreasing from one end thereof towards the other colored ink coating to another end thereof and partially mixed with the other colored ink coating.

12 Claims, 5 Drawing Sheets

HOUSING AND METHOD FOR MAKING THE SAME

BACKGROUND OF THE INVENTION

1. Field of the Invention

The present invention relates to housings and, particularly, to a housing for mobile devices and a method for making the housing.

2. Discussion of the Related Art

Mobile devices, such as mobile telephones, personal digital assistants, or MP3 players, enable consumers to enjoy the convenience of high technology services, anytime and at virtually any location. These mobile devices often employ any of a variety of decorative housings to attract consumers. Colored inks are typically applied onto surfaces of the housings to provide the necessary decorative appearance.

However, typical housings are single-colored. However, consumers are desiring multi-color housing appearances.

Therefore, there is room for improvement within the art.

BRIEF DESCRIPTION OF THE DRAWINGS

Many aspects of the housing can be better understood with reference to the following drawing. The components in the drawing are not necessarily to scale, the emphasis instead being placed upon clearly illustrating the principles of the present housing. Moreover, in the drawing, like reference numerals designate corresponding parts throughout the following view.

DETAILED DESCRIPTION OF THE EMBODIMENTS

Figure 1:
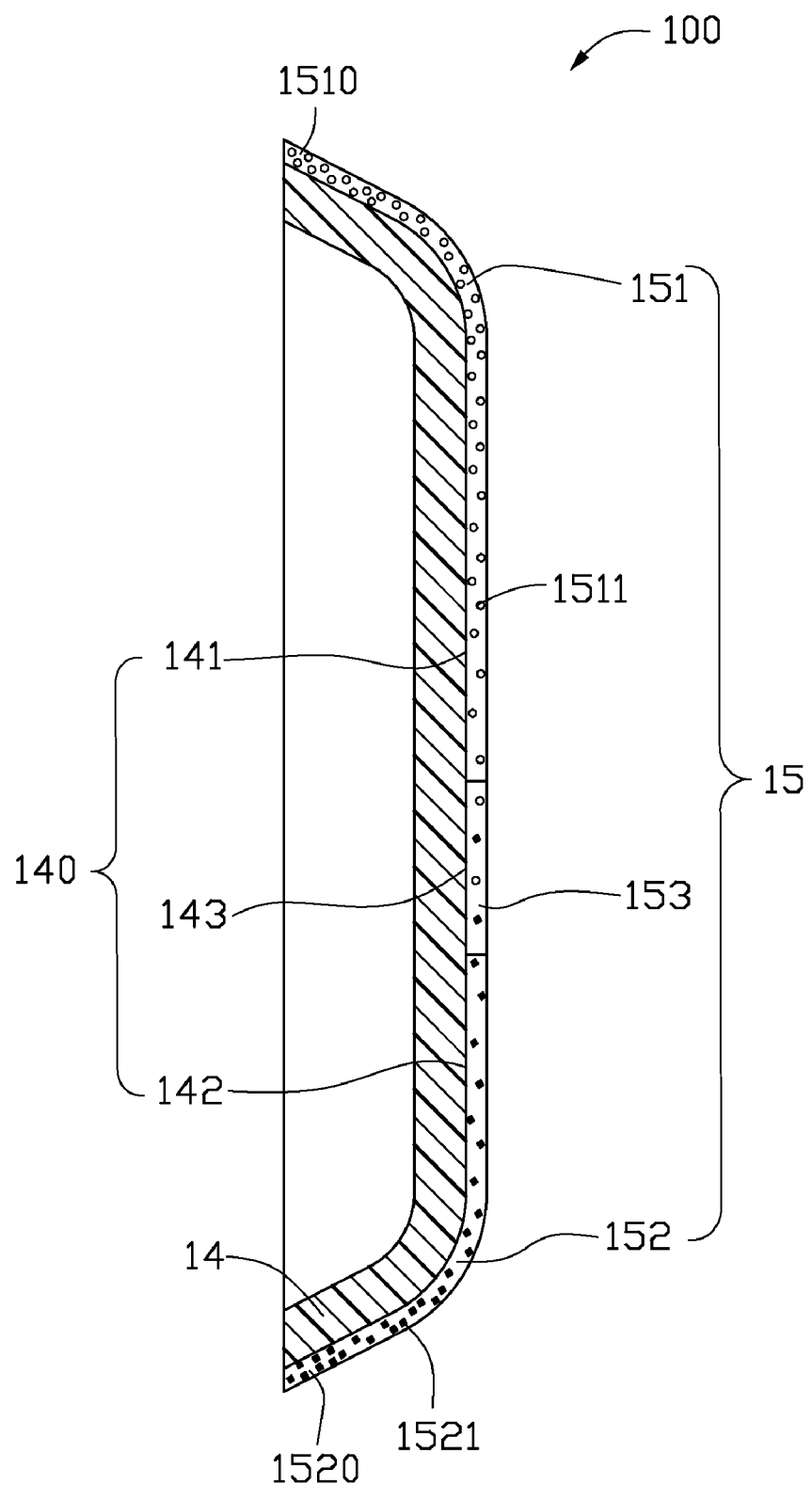
FIG. 1 is a section view of an exemplary embodiment of the present housing.

Referring to FIG. 1, in a present embodiment, a housing 100 is used for mobile phones, laptop computers, cameras, or game player devices. The housing 100 includes a substrate 14 and a decorative layer 15 formed on the substrate 14.

The substrate 14 may be made of plastic or metal and has a surface 140 including a first section 141, a second section 142, and a third section 143 positioned between the first section 141 and the second section 142.

The decorative layer 15 includes a first colored ink coating 151 and a second colored ink coating 152, which are partially mixed together in different amounts in different areas. The first colored ink coating 151 and the second colored ink coating 152 are different in color. The first colored ink coating 151 is formed on the first section 141 and the third section 143 of the surface 140. The second colored ink coating 152 is formed on the second section 142 and third section 143 of the surface 140. That is, the first colored ink coating 151 and the second colored ink coating 152 are partially mixed together at the third section 143, thereby forming a middle portion 153 mixing the first colored ink coating 151 and the second colored ink coating 152.

The first colored ink coating 151 is formed of a plurality of first ink particles 1511 dispersed and distributed on the first section 141 and the third section 143. The distribution density of the first ink particles 1511 decreases as the distance from one end 1510 of the first colored ink coating 151 towards the second colored ink coating 152 at the middle portion 153. Thus, the color depth of the first colored ink coating 151 decreases as the distance from the end 1510 of the first colored ink coating 151 towards the second colored ink coating 152 to the middle portion 153. The second colored ink coating 152 is formed of a plurality of second ink particles 1521 dispersed and distributed on the second section 142 and third section 143. The distribution density of the second ink particles 1521 decreases as the distance from one end 1520 of the second colored ink coating 152 towards the first colored ink coating 151 to the middle portion 153. That is, the color depth of the second colored ink coating 152 decreases as the distance from the end 1520 of the second colored ink coating 152 towards the first colored ink coating 151 to the middle portion 153. As such, a smooth transition between the first colored ink coating 151 and the second ink coating 152 is achieved in the area of middle portion 153.

Figure 2:
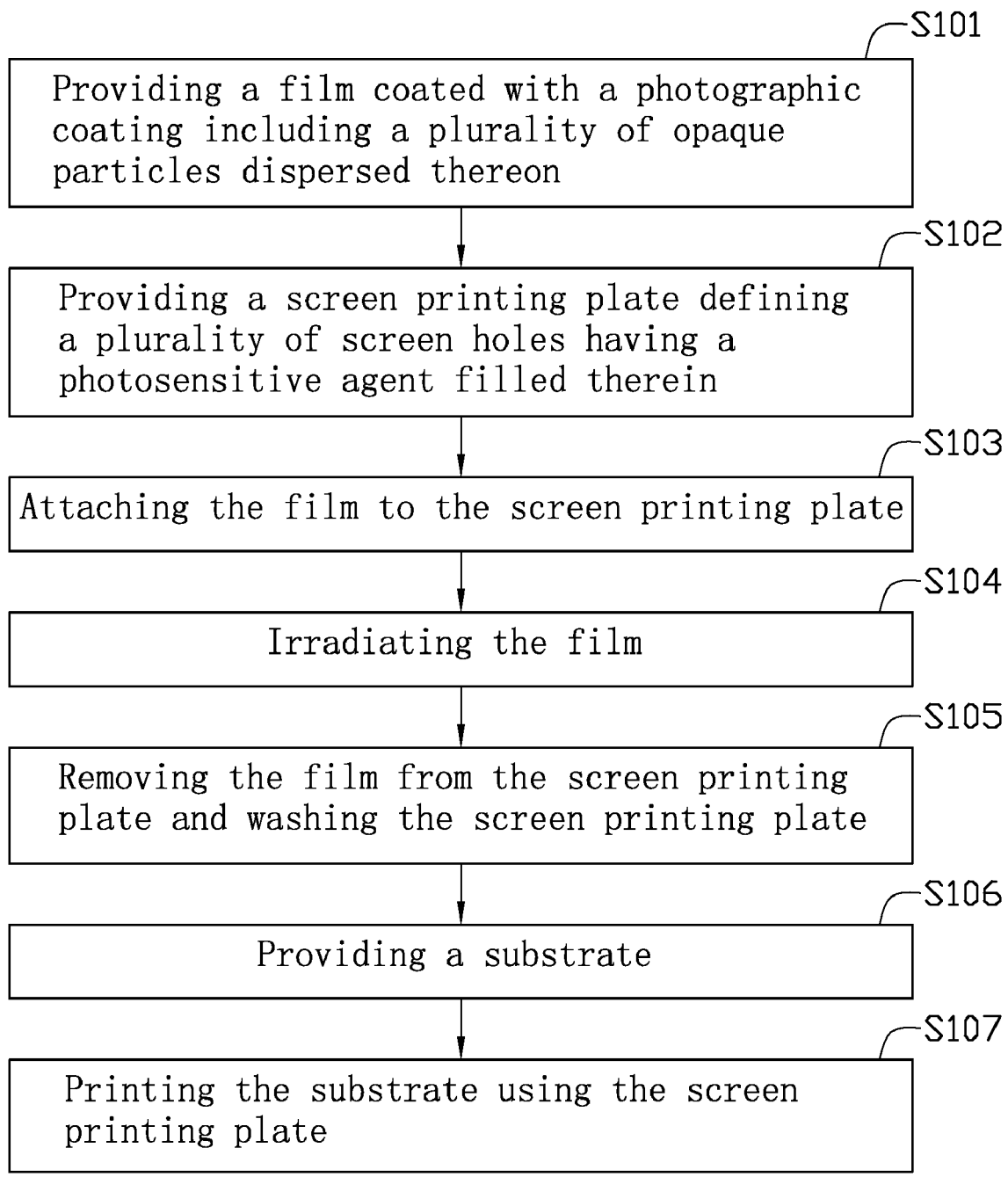
FIG. 2 is a flow chart of a method for making a housing, in accordance with a present embodiment.

Referring to FIG. 2, an exemplary method for making the housing 100 may includes steps S101 to S107.

Figure 3:
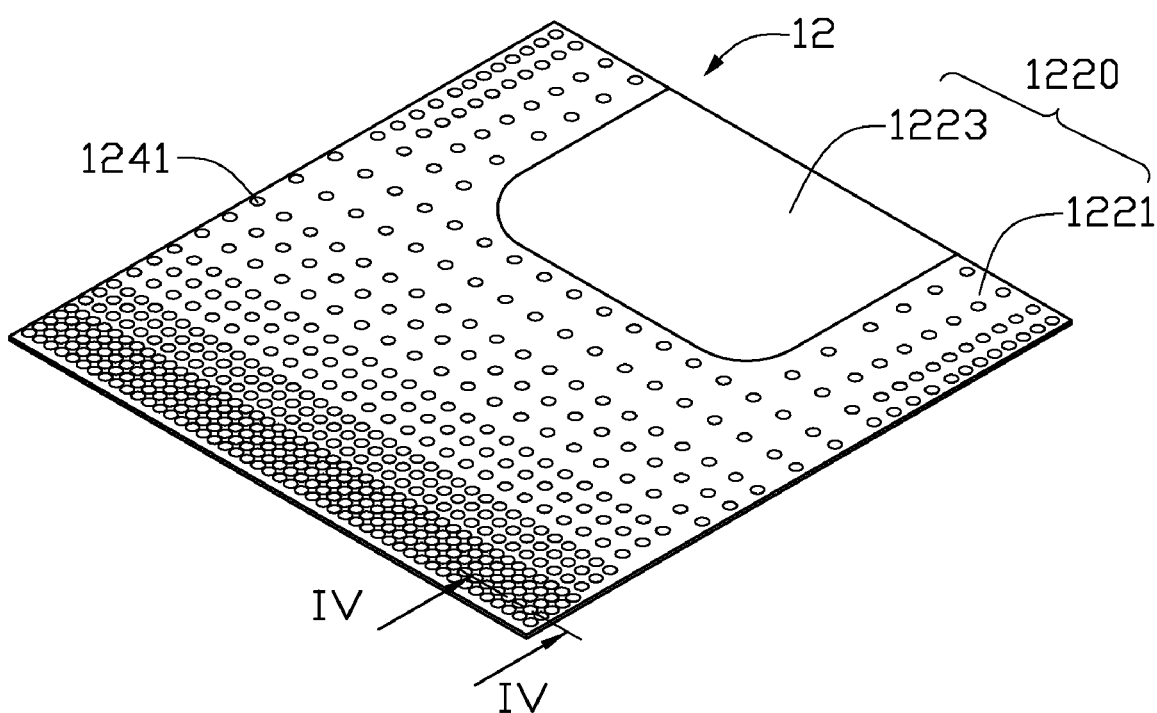
FIG. 3 is schematic view of an exemplary embodiment of a film used in the method shown in FIG. 2.
Figure 4:
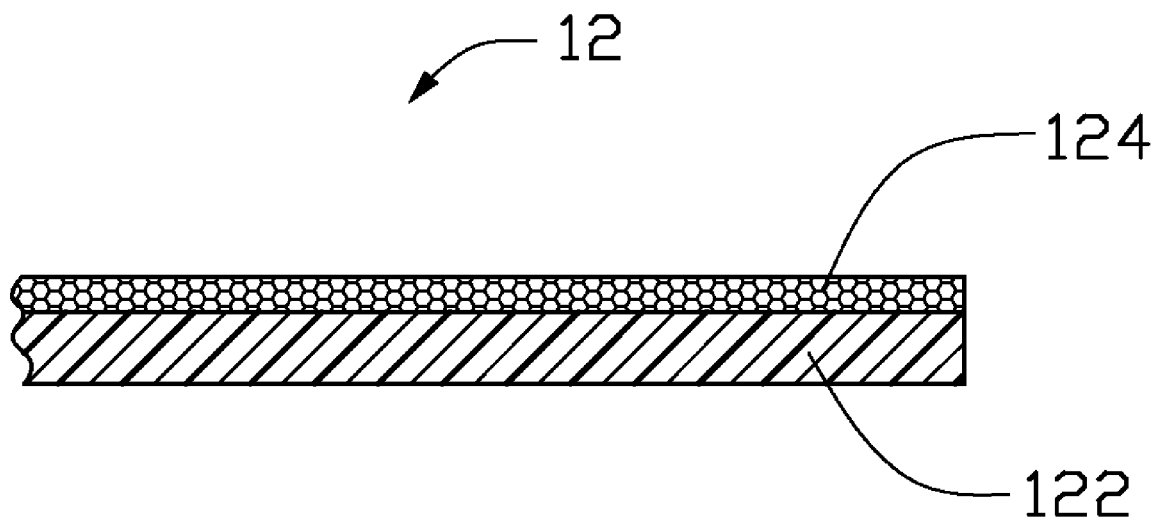
FIG. 4 is a cut-away view along line III-III in FIG. 3.

In a first step S101, referring to FIGS. 2 to 4, a film 12 is provided. The film 12 includes a transparent film base 122 and a photographic coating 124 including a plurality of opaque particles 1241. The film base 122 defines a working surface 1220 including a sensitizer-coated surface portion 1221 and a non-coated surface portion 1223. The plurality of opaque particles 1241 of the photographic coating 124 are dispersed and distributed on the sensitizer-coated surface portion 1221. That is, the sensitizer-coated surface portion 1221 is partially covered by the opaque particles 1241. The distribution density of the opaque particles 1241 decreases as the distance from one end towards the non-coated surface portion 1223 to another end adjacent to the non-coated surface portion 1223.

Figure 5:
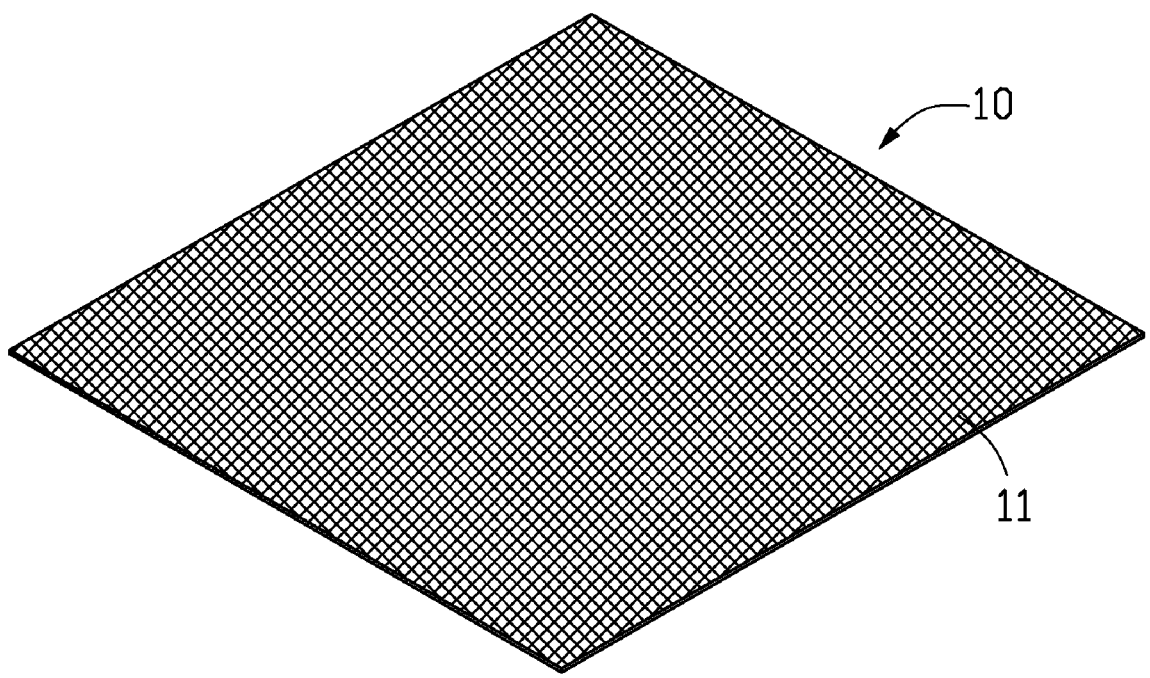
FIG. 5 is a cut-away view of an exemplary embodiment of the present housing.

In a second step S102, a screen printing plate 10 shown FIG. 5 is provided. The screen printing plate 10 defines a plurality of screen holes 11 enabling ink drops to pass through. The screen holes 11 of the screen printing plate 10 are filled with a photosensitive agent. The photosensitive agent comprises a bonding agent system including epoxy resin and a sensitizer system including silver bromide (AgBr) and poly vinyl alcohol (PVA). The photosensitive agent may be changed into an insoluble component after being irradiated by light, as silver bromide may react with poly vinyl alcohol to form an insoluble compound.

In a third step S103, the film 12 is attached to the screen printing plate 10, with the working surface 1220 facing the screen printing plate 10. As such, the screen holes 11 may be divided into a first group not covered by the opaque particles and a second group covered by the opaque particles.

In a fourth step S104, the film 12 is irradiated with a light beam. The light beam passes through the non-coated surface portion 1223 of the film 12, thereby irradiating a portion of the screen printing plate 10 covered by the non-coated surface portion 1223. As the opaque particles 1241 are dispersed on the sensitizer-coated surface portion 1221, the sensitizer-coated surface portion 1221 is partially penetrable by light. The light beam penetrates areas of the sensitizer-coated surface portion 1221 not covered by the opaque particles 1241 and then irradiates the photosensitive agent filled in the first group of the screen holes 11, thereby changing the irradiated photosensitive agent into an insoluble component. The light beam may not penetrate areas of the sensitizer-coated surface portion 1221 covered by the photosensitive particles 1241, and accordingly, the other part of the photosensitive agent, which is filled in the second group of the screen holes 11 beneath the photosensitive particles 1241 is un-irradiated.

In a fifth step S105, the film 12 is removed from the screen printing plate 10. The screen printing plate 10 is then washed in water. The un-irradiated photosensitive particles 1241 are washed away from the screen printing plate 10. The irradiated photosensitive agent changes into the insoluble component and blocks the second group of the screen holes 11. Thus, the first group of the screen holes 11 are unblocked. The unblocked screen holes 11 accordingly have a distribution character similar to that of the opaque particles on the film 12. That is, the distribution density of the unblocked screen holes 11 decreases as the distance from the ends of the screen printing plate 10.

Referring to FIG. 5, in a sixth step S106, the substrate 14 is provided.

In an seventh step S107, the substrate 14 is coated with an ink by a screen printing process using the screen printing plate 10. The screen printing plate 10 is firstly coated with a colored ink and then applied to cover the substrate 14. The colored ink fills the unblocked screen holes 11 of the screen printing plate 10. The colored ink is then dropped onto the substrate 14 by exerting a force onto the screen printing plate 10 so as to form the first colored ink coating 151 on the first section 141 and the second section 142. Thus, the quantity of the colored ink dropped onto the substrate 14 decreases as the distance from the ends of the substrate 14, according to the distribution character of the unblocked screen holes 11. That is, the color depth of the first colored ink coating 151 decreases as the distance from the first section 141 to the second section 142.

It is understandable that the second colored ink coating 152 can also be printed on the second surface portion 142 and the third surface portion 143 by using the screen printing plate 10, thereby forming a housing 100 with a two-colored appearance having a smooth transition between the first colored ink coating 151 and the second ink coating 152.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for making a housing, comprising the steps of:
   providing a film having a plurality of opaque particles distributed thereon, the distribution density of the opaque particles decreasing with an increase in distance from one end to the other end of the film;
   providing a screen printing plate defining a plurality of screen holes, the screen holes being filled with a photosensitive agent capable of changing into an insoluble component under irradiation;
   attaching the film onto the screen printing plate;
   irradiating the film attached to the screen printing plate;
   removing the film from the screen printing plate;
   washing the screen printing plate;
   printing a first ink coating onto a substrate using the screen printing plate.

2. The method as claimed in claim 1, wherein the photosensitive agent includes a bonding agent system and a sensitizer system.

3. The method as claimed in claim 2, wherein the bonding agent system includes epoxy resin.

4. The method as claimed in claim 2, wherein the sensitizer system includes silver bromide and poly vinyl alcohol.

5. The method as claimed in claim 1, wherein the film includes a transparent film base and a photographic coating formed of the opaque particles.

6. The method as claimed in claim 5, wherein the opaque particles are dispersed on the transparent film base.

7. The method as claimed in claim 1, wherein during the step of irradiating the film attached to the screen printing plate, the photosensitive agent being partially irradiated, and the screen holes being partially blocked by the irradiated photosensitive agent.

8. The method as claimed in claim 7, wherein during the step of washing the screen printing plate, the photosensitive agent not irradiated being washed away from the screen holes, thereby forming a group of unblocked screen holes, the unblocked screen holes having a distribution character similar to that of the opaque particles on the film.

9. The method as claimed in claim 1, the method for making a housing further comprising a step of using the screen printing plate to print another ink coating on the substrate.

10. The method as claimed in claim 9, wherein the ink coatings are partially mixed together in different amounts in different areas on the substrate with each other, each of the ink coatings having a color depth decreasing from one end thereof to another end thereof.

11. The method as claimed in claim 9, wherein further comprising a step of printing a second ink coating onto the substrate using the screen printing plate, the first and second colored ink coatings being partially mixed together in different amounts in different areas on the substrate, each of the first and second colored ink coatings having a color depth decreasing from one end thereof towards the other colored ink coating to another end thereof and partially mixed with the other colored ink coating.

12. The method as claimed in claim 7, wherein during the step of irradiating the film attached to the screen printing plate, the parts of the film having the opaque particles are un-penetrable of light for shielding, and the screen holes beneath the parts of the film are not blocked.

* * * * *